United States Patent [19]

Pierce

[11] 4,352,239
[45] Oct. 5, 1982

[54] PROCESS FOR SUPPRESSING ELECTROMIGRATION IN CONDUCTING LINES FORMED ON INTEGRATED CIRCUITS BY CONTROL OF CRYSTALLINE BOUNDARY ORIENTATION

[75] Inventor: John M. Pierce, Palo Alto, Calif.

[73] Assignee: Fairchild Camera and Instrument, Mountain View, Calif.

[21] Appl. No.: 141,040

[22] Filed: Apr. 17, 1980

[51] Int. Cl.³ .......................................... H01L 21/477
[52] U.S. Cl. ........................................ 29/590; 148/13; 148/20.3
[58] Field of Search ....................... 148/13, 13.1, 20.3; 29/589, 590, 591; 75/138, 139

[56] References Cited

U.S. PATENT DOCUMENTS 3,848,330  11/1974  Hall et al. ............................. 75/139

Primary Examiner—R. Dean
Attorney, Agent, or Firm—Kenneth Olsen; Michael J. Pollock; Theodore Scott Park

[57] ABSTRACT

A process for suppressing electromigration in conducting lines formed on integrated circuit structures includes the steps of forming the conducting lines on the integrated circuit structure and heat treating the lines to cause the average grain size in the lines to become larger than the width of the conducting lines.

2 Claims, 4 Drawing Figures

PROCESS FOR SUPPRESSING ELECTROMIGRATION IN CONDUCTING LINES FORMED ON INTEGRATED CIRCUITS BY CONTROL OF CRYSTALLINE BOUNDARY ORIENTATION

BACKGROUND OF THE INVENTION

1. Field of the Invention

This invention relates to integrated circuits and integrated circuit structures, and in particular, to a technique for suppressing electromigration in conducting lines formed on integrated circuit structures.

2. Description of the Prior Art

The phenomenon of electromigration, that is, transfer of material along a conducting line, in integrated circuit technology is well known. Although the phenomenon is not completely understood, it is widely believed that material is moved along the electric conductor by the presence of the electric field and electron flow momentum. One measure of the ease of electromigration in a given material formed under given conditions is the electromigration activation energy, which is a quantitative measure of the potential energy barrier heights that the electromigrating atoms must overcome to move from one position in a lattice to another. The electromigration activation energy is related to the activation energies for ordinary thermal diffusion. In an aluminum film the activation energy usually observed for electromigration is 0.5 to 0.7 electron volts (herein eV). The activation energy for bulk diffusion in aluminum is approximately 1.3–1.5 eV.

It is known that electromigration in polycrystalline films proceeds substantially along grain boundaries. Grain boundaries are disordered regions between the crystalline grains which offer an easier path for diffusion of the atoms being transported. The grain boundaries are characterized by a lower activation energy for diffusion than that for the bulk or crystalline grain.

Some electromigration experiments have been published in which single crystal aluminum films were prepared by epitaxial techniques to create an entire conducting line comprised of a single crystalline grain. Films fabricated in such a manner exhibit drastically reduced electromigration compared with ordinary polycrystalline films, and in fact have activation energies characteristic of bulk diffusion, for example, 1.3 eV. See, for example, F. d'Heurle and I. Ames, "Electromigration in Single Crystal Aluminum Films," Appl. Phys. Lett. 16, 80 (1970). Single crystal films, however, are obviously impractical to produce on actual integrated circuits in production quantities.

SUMMARY OF THE INVENTION

It is an object of this invention to provide a process for suppressing electromigration in conducting lines formed on integrated circuit structures, fabricated using commercially practical processes.

With the above knowledge, I hypothesized that grain boundary electromigration may be suppressed by ensuring that no grain boundaries extend an appreciable distance along the length of a conductor, as opposed to its width. This requires that the crystalline grains of the film be at least as large as the width of the conducting lines, which is almost always greater than the thickness of the film. It is not necessarily sufficient, however, to form large grained films. Numerous experiments (see e.g., F. M. d'Heurle and P. S. Ho, "Electromigration in Thin Films," in "Thin Films—Interdiffusion and Reactions," J. M. Poate, K. N. Tu, and J. W. Mayer, eds. Wiley, N.Y., 1978, pp 243–303.) have shown that large grained metal films have less electromigration than small grained films, but these experiments have not shown spectacular increases in activation energies, for example, comparable to those for bulk diffusion. In a typical case where a conductor is etched from a polycrystalline film, the position of boundaries relative to the conductor boundaries is not controlled. Thus, unless the average grain size is comparable to the conductor length, there is a high probability that there will be a grain boundary extending some distance along the length of the line, and it is this boundary which will frequently cause an early electromigration failure in the conducting line.

I have invented a new process which includes the steps of forming conducting lines on an integrated circuit structures and subsequently heat treating the conducting lines to create a grain geometry in which grain boundaries do not extend along the length of a conducting line, but rather approximately directly across it. The process produces polycrystalline film conducting lines in which the microstructure or grain geometry suppresses electromigration along grain boundaries. The effect is that electromigration will occure substantially only through the grains, which have activation energies much higher than the grain boundaries. Therefore the electromigration lifetimes are much longer than usually observed in polycrystalline conducting lines.

The process of this invention provides the means of orienting the grain boundaries relative to the conductor geometry such that there are no grain boundaries extending any significant distance along the conducting line, only almost directly across it. This is achieved by heat treating the device after the conducting lines are formed under conditions which cause the average grain size to grow somewhat larger than the width of the conducting lines. The grain boundaries formed during such a process naturally tend to orient themselves across the conducting lines, because in that manner the total boundary length may be minimized.

DESCRIPTION OF THE PREFERRED EMBODIMENT

Figure 1:
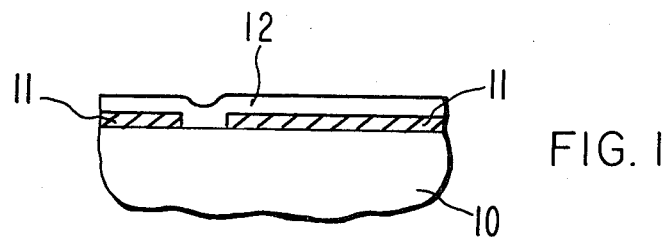
FIG. 1 is a cross sectional view of a hypothetical semiconductor structure showing a substrate 10, an oxide layer 11, and a conducting layer 12.

FIG. 1 is a simplified cross sectional view of a hypothetical semiconductor structure. Shown in FIG. 1 is a substrate 10 which may include various regions of impurities (not shown) which form numerous active and/or passive electronic components (not shown). Across the surface of substrate 10, an insulating layer 11, typically silicon dioxide, has been formed. Using well known technology, openings are made through insulating layer 11 in various regions where connections between conducting layer 12 and substrate 10 are desired. The techniques for forming a structure such as depicted in FIG. 1 are well known in the semiconductor fabrication arts.

Figure 2:
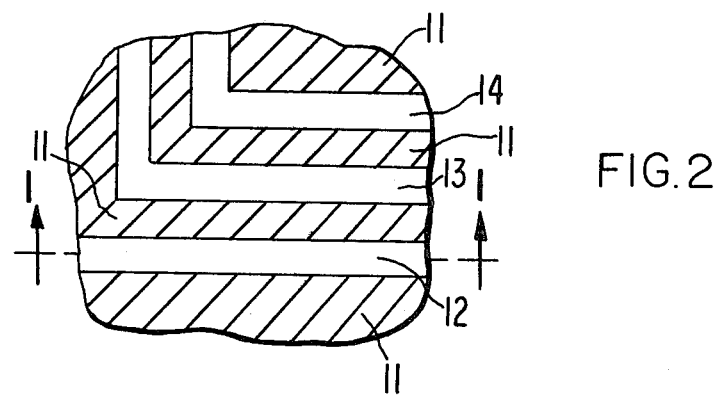
FIG. 2 is a top view of the structure shown in FIG. 1.

FIG. 2 shows a top view of the structure shown in FIG. 1, illustrating the presence of numerous, relatively narrow, conducting lines 12, 13 and 14 formed on the surface of substrate 10 and insulating material 11. Conducting lines 12, 13 and 14 are formed, for example, of aluminum, using well known semiconductor technology.

Figure 3:
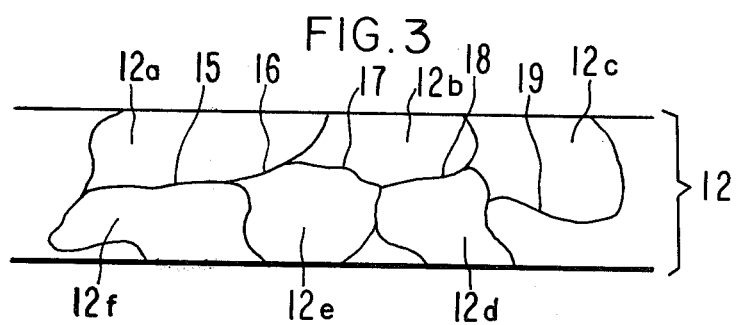
FIG. 3 is an enlarged view of a conducting line showing randomly oriented crystal grain boundaries.

FIG. 3 is an enlarged view of conducting line 12 showing the presence of various grains 12a to 12f of conducting material. Grains 12a through 12f are hypothetical in shape, and a similar structure will extend along the full length of conducting line 12. Also note how portions of the boundaries of the various grains 12a through 12f, by chance, might form a significantly long grain boundary extending along the length of the conductor. This is illustrated by the portions of grains 12a through 12f designated 15 through 19. It is along such a grain boundary extending in the same direction as the conducting line that electromigration will occur most readily, and therefore that failure is most prone.

Figure 4:
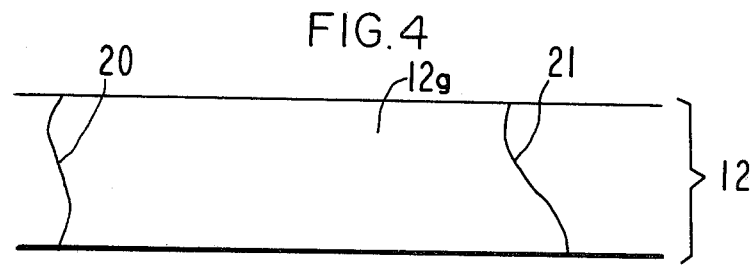
FIG. 4 is an enlarged view of a conducting line fabricated according to this invention.

FIG. 4 depicts the appearance of conducting line 12 after it has been heat treated. Note that grain boundaries 20 and 21 extend almost perpendicularly across the width of conducting line 12. For this reason, as previously discussed, it is difficult for electromigration to occur, and the likelihood of failure of such a conducting line due to electromigration is made much less probable.

In the preferred embodiment of the invention the heat treatment necessary to create such a structure was to heat the aluminum line to 480° C. for 50 minutes in oxygen. The line so heat treated was 6 microns wide and 1 micron thick by 250 microns long. The heat treatment also has been found effective in aluminum silicon lines.

I claim:
1. A method for fabricating a polycrystalline interconnection on a semiconductor structure, which interconnection resists electromigration, the method comprising the steps of:
   (a) forming a polycrystalline interconnection on the semiconductor structure by depositing a line of aluminum to create a line having grain boundaries extending both along the length of the line and across the width of the line, and
   (b) reorienting the grain boundaries of the interconnection to extend only across the width of the line by heating the interconnection at approximately 480° C. for approximately 50 minutes in order to expand the grains to a width greater than the width of the line, whereby electromigration along the length of the line is suppressed by removing boundaries that extend along the length of the line.
2. The method of claim 1 wherein the interconnection is heated in oxygen.

* * * * *